(12) United States Patent
Rogovin et al.

(10) Patent No.: US 7,027,937 B2
(45) Date of Patent: Apr. 11, 2006

(54) METHODS AND SYSTEMS FOR TESTING WIRE INSULATION

(75) Inventors: Daniel N. Rogovin, Newbury Park, CA (US); Martin W. Kendig, Thousand Oaks, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 10/902,513

(22) Filed: Jul. 29, 2004

(65) Prior Publication Data

US 2006/0025940 A1    Feb. 2, 2006

(51) Int. Cl.
*G01R 31/00* (2006.01)

(52) U.S. Cl. .......................... 702/57; 324/525; 324/544

(58) Field of Classification Search ................ 702/57, 702/65; 324/525, 544
See application file for complete search history.

(56) References Cited

U.S. PATENT DOCUMENTS 6,051,980 A * 4/2000 Divljakovic et al. ........ 324/544
6,472,885 B1 * 10/2002 Green et al. ................ 324/638
2004/0183544 A1 * 9/2004 Allan et al. ................. 324/533

OTHER PUBLICATIONS

Braunisch, Henning and Han, Dong-Ho;"Broadband Characterization of Package Dielectrics;" 2003 Electronics Components and Technology Conference, IEEE; p. 1258-1263.*

* cited by examiner

*Primary Examiner*—Hal Wachsman
*Assistant Examiner*—Janet Robbins
(74) *Attorney, Agent, or Firm*—Sonnenschein Nath & Rosenthal LLP

(57) ABSTRACT

Methods, systems, and articles of manufacture consistent with the present invention provide for determining the environmental resistance of a wire insulation. The broadband impedance of the wire is obtained before and after the wire is exposed to an environmental condition. The real and imaginary components of the dielectric functions are then extracted from the broadband impedances. A tangent of a ratio of the imaginary component to the real component of the dielectric function of the wire prior to exposure is compared to a tangent of a ratio of the imaginary component to the real component of the dielectric function of the wire after to exposure. The two tangents are then compared to determine the environmental resistant of the insulation.

19 Claims, 11 Drawing Sheets

MEASURED IMPEDANCE MAGNITUDE SPECTRUM
OPEN-CIRCUIT CONFIGURATION

MEASURED IMPEDANCE MAGNITUDE SPECTRUM
CLOSED-CIRCUIT CONFIGURATION

MEASURED IMPEDANCE PHASE SPECTRUM
CLOSED-CIRCUIT CONFIGURATION

REAL COMPONENT OF THE DIELECTRIC FUNCTION

IMAGINARY COMPONENT OF THE DIELECTRIC FUNCTION

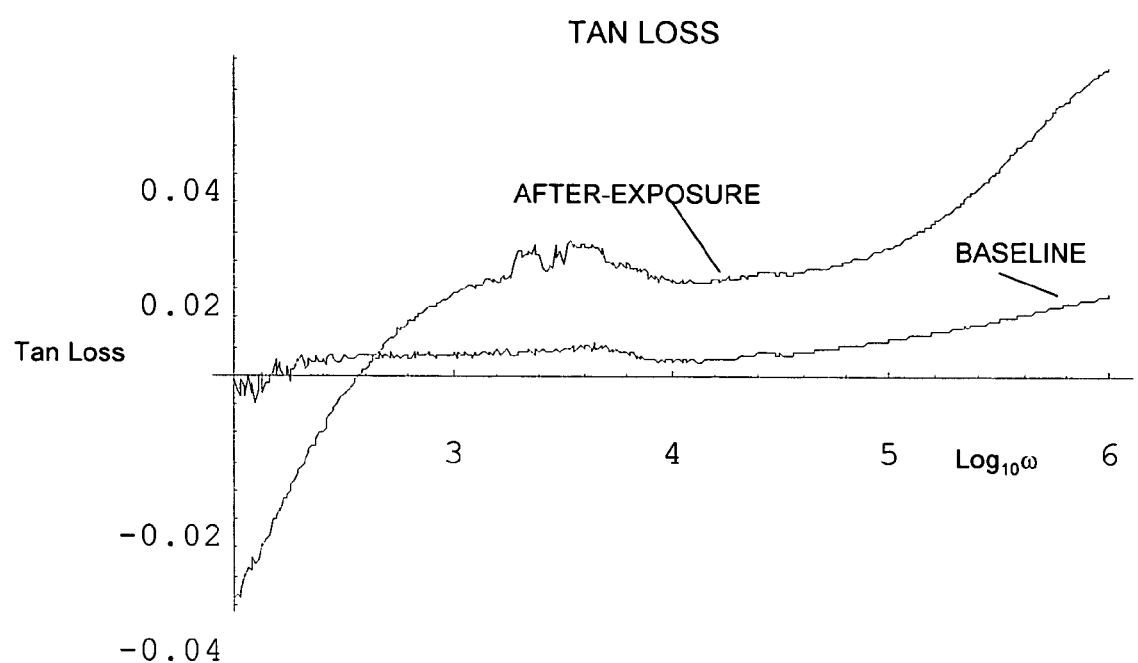

METHODS AND SYSTEMS FOR TESTING WIRE INSULATION

GOVERNMENT CONTRACT

This invention was made with Government support under contract number DTFA-03-C-00014, awarded by the Federal Aviation Administration. The government has certain rights in this invention.

BACKGROUND OF THE INVENTION

The present invention generally relates to the field of electrical wire testing and, more particularly, to methods and system for testing wire insulation using broadband impedance.

Humidity and other environmental conditions (e.g., heat, radiation, etc.) can degrade a wire insulation. Eventually, the degradation can lead to a wire failure, such as a short circuit or signal loss. Different wire insulation types and formulations have different physical properties, and therefore exhibit different responses to environmental conditions.

Conventional approaches for selecting wire insulation, such as full-scale exposure tests and accelerated exposure tests, require subjecting an insulated wire to various environmental conditions for long periods of time. Accelerated exposure tests, which are usually faster than full-scale exposure tests, generally require the wire insulation be exposed for at least one month. Thus, the conventional exposure tests take a long time, which is a disadvantage when analyzing a large number of insulations or environmental conditions.

Further, conventional approaches typically provide pass/fail information on whether an insulation passes or fails a test, yet fail to provide quantitative measurement data. For example, a conventional approach may identify that a wire insulation fails a test because the insulation becomes soft after exposure to hydraulic fluid for a sustained period. However, the conventional approach fails to provide quantitative measured data on how the change in insulation characteristics affects the insulation.

SUMMARY OF THE INVENTION

Methods, systems, and articles of manufacture consistent with the present invention provide a determination of the environmental resistance of a wire insulation by observing changes in the wire's dielectric function, which is extracted from the wire's measured broadband impedance. The tan loss of the baseline and after-exposure dielectric functions are calculated and compared. As described in more detail below, the "tan loss" for purposes of this disclosure is the tangent of the ratio of the imaginary component of the dielectric function to the real component of the dielectric function. The tan loss of the insulated wire exhibits different characteristics depending on how the insulated wire is affected by an environmental condition. If the insulated wire is not affected by the environmental condition, then the tan loss of the after-exposure dielectric function should be substantially the same as the tan loss of the baseline dielectric function. However, the more the insulated wire is affected by the environmental condition, the greater the difference will be between the tan loss of the after-exposure dielectric function and the tan loss of the baseline dielectric function. The obtained quantitative measurement of an insulation's susceptibility to an environmental condition can be used to develop an insulation appropriate for a specific application.

In accordance with methods consistent with the present invention, a method in a data processing system having a program for determining the environmental resistance of a wire insulation is provided. The method comprises the steps of: obtaining a first broadband impedance of the wire prior to the wire being exposed to an environmental condition; obtaining a broadband impedance of the wire after the wire has been exposed to the environmental condition; extracting a first real component and a first imaginary component of a first dielectric function of the wire from the first broadband impedance; extracting a second real component and a second imaginary component of a second dielectric function of the wire from the second broadband impedance; calculating a first tangent of a ratio of the first imaginary component to the first real component of the first dielectric function; calculating a second tangent of a ratio of the second imaginary component to the second real component of the second dielectric function; and determining the environmental resistance of the wire insulation by comparing the first tangent to the second tangent.

In accordance with articles of manufacture consistent with the present invention, a computer-readable medium containing instructions that cause a data processing system having a program to perform a method for determining the environmental resistance of a wire insulation is provided. The method comprises the steps of: obtaining a first broadband impedance of the wire prior to the wire being exposed to an environmental condition; obtaining a broadband impedance of the wire after the wire has been exposed to the environmental condition; extracting a first real component and a first imaginary component of a first dielectric function of the wire from the first broadband impedance; extracting a second real component and a second imaginary component of a second dielectric function of the wire from the second broadband impedance; calculating a first tangent of a ratio of the first imaginary component to the first real component of the first dielectric function; calculating a second tangent of a ratio of the second imaginary component to the second real component of the second dielectric function; and determining the environmental resistance of the wire insulation by comparing the first tangent to the second tangent.

In accordance with systems consistent with the present invention, a data processing system for determining the environmental resistance of a wire insulation is provided. The data processing system comprises a memory having a program that: obtains a first broadband impedance of the wire prior to the wire being exposed to an environmental condition, obtains a broadband impedance of the wire after the wire has been exposed to the environmental condition, extracts a first real component and a first imaginary component of a first dielectric function of the wire from the first broadband impedance, extracts a second real component and a second imaginary component of a second dielectric function of the wire from the second broadband impedance, calculates a first tangent of a ratio of the first imaginary component to the first real component of the first dielectric function, calculates a second tangent of a ratio of the second imaginary component to the second real component of the second dielectric function, and determines the environmental resistance of the wire insulation by comparing the first tangent to the second tangent. A processing unit runs the program.

In accordance with systems consistent with the present invention, a data processing for determining the environmental resistance of a wire insulation is provided. The data processing system comprises: means for obtaining a first broadband impedance of the wire prior to the wire being exposed to an environmental condition; means for obtaining a broadband impedance of the wire after the wire has been exposed to the environmental condition; means for extracting a first real component and a first imaginary component of a first dielectric function of the wire from the first broadband impedance; means for extracting a second real component and a second imaginary component of a second dielectric function of the wire from the second broadband impedance; means for calculating a first tangent of a ratio of the first imaginary component to the first real component of the first dielectric function; means for calculating a second tangent of a ratio of the second imaginary component to the second real component of the second dielectric function; and means for determining the environmental resistance of the wire insulation by comparing the first tangent to the second tangent.

Other features of the invention will become apparent to one with skill in the art upon examination of the following figures and detailed description. It is intended that all such additional systems, methods, features, and advantages be included within this description, be within the scope of the invention, and be disclosed by the accompanying drawings.

BRIEF DESCRIPTION OF THE DRAWINGS

The accompanying drawings, which are incorporated in and constitute a part of this specification, illustrate an implementation of the invention and, together with the description, serve to explain the advantages and principles of the invention. In the drawings.

FIG. 11 is a graphical representation of the baseline and after-exposure tan losses.

DETAILED DESCRIPTION OF THE INVENTION

Reference will now be made in detail to an implementation in accordance with methods, systems, and articles of manufacture consistent with the present invention as illustrated in the accompanying drawings. Wherever possible, the same reference numbers will be used throughout the drawings and the following description to refer to the same or like parts.

Methods, systems, and articles of manufacture consistent with the present invention test wire insulation for its resistance to environmental conditions using broadband impedance measurements. Through experimentation, the inventors have determined that the broadband impedance of an insulated wire is sensitive to changes in the insulation that result from exposure to environmental conditions. The broadband impedance reveals that environmental conditions can cause the insulation to become more conductive compared to its original state. Methods, systems, and articles of manufacture consistent with the present invention use broadband impedance measurements to determine the effects of environmental conditions on insulated wire, without the need for conventional time-consuming exposure tests or conventional accelerated exposure tests.

Figure 1:
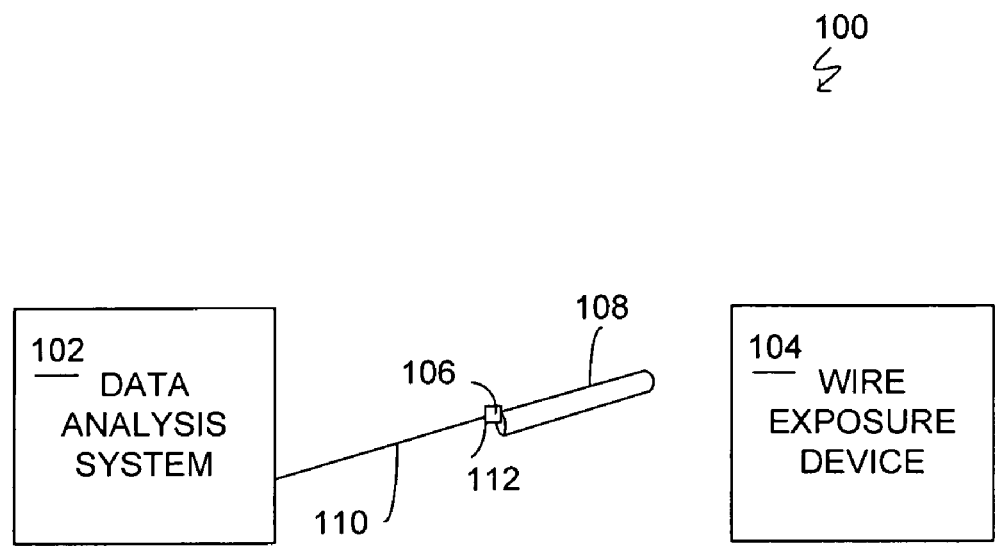
FIG. 1 is a schematic diagram of an illustrative example of a system for testing wire insulation in accordance with methods and systems consistent with the present invention.

FIG. 1 depicts a system 100 for testing wire insulation in accordance with methods and systems consistent with the present invention. As shown, the system 100 generally comprises a data analysis system 102 and a wire exposure device 104. Data analysis system 102 electrically couples to a measurement point 106 of an insulated wire 108 via a cable 110. Cable 110 electrically couples to insulated wire 108 via a connector 112, such as a banana clip or other type of connector. As will be described below, data analysis system 102 measures the impedance of the insulated wire and determines the affects of environmental conditions on the insulated wire.

Figure 2:
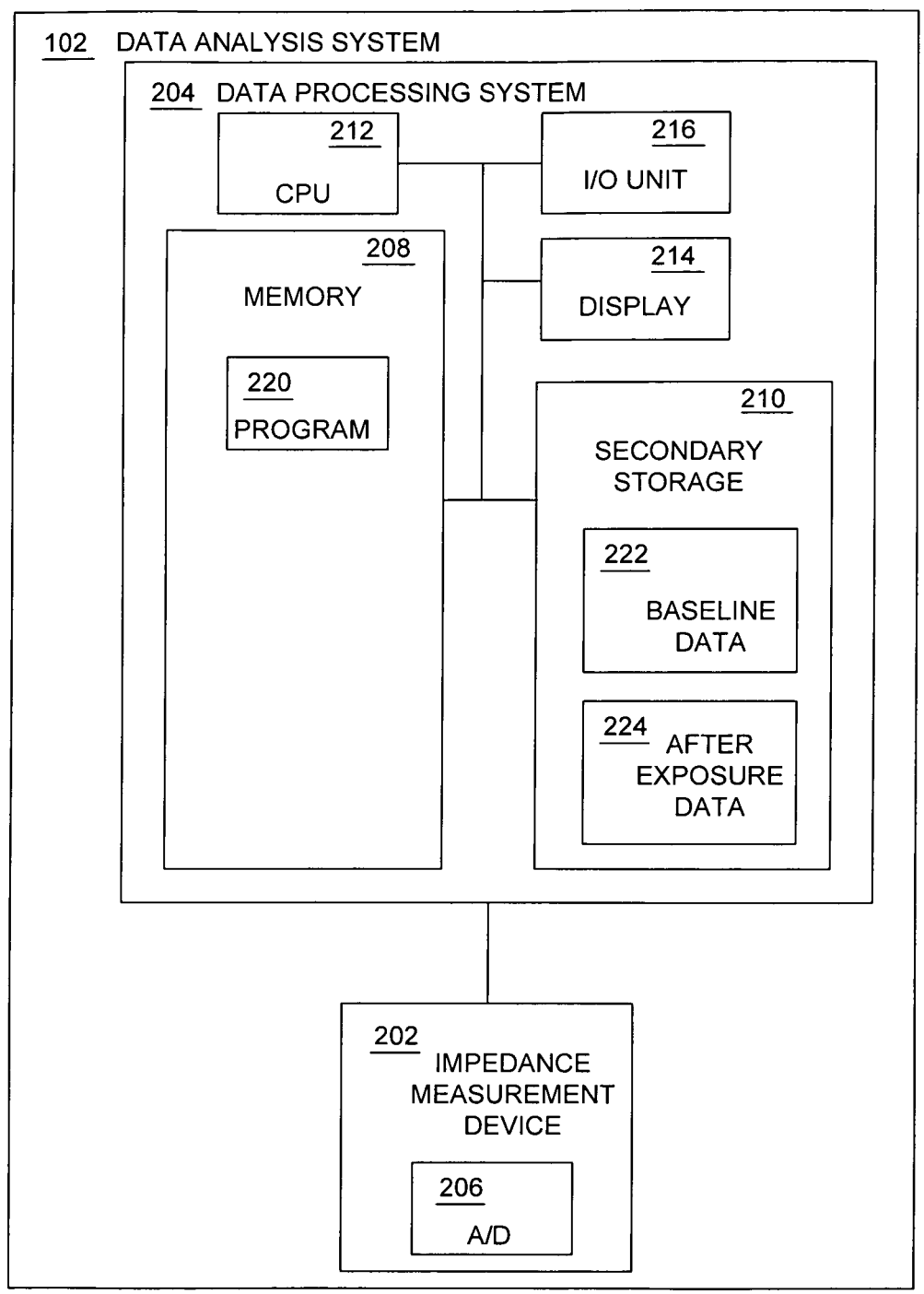
FIG. 2 is a block diagram of a data analysis system consistent with the present invention.

FIG. 2 depicts data analysis system 102 in more detail. The data analysis system comprises an impedance measurement device 202 and a data processing system 204. Impedance measurement device 202 measures the magnitude and phase of the broadband input impedance of the insulated wire, and can be a suitable off-the-shelf impedance measurement device. For example, the impedance measurement device can be, but is not limited to, the 4294A Precision Impedance Analyzer manufactured by Agilent Technologies, Inc. of Palo Alto, Calif., U.S.A. As impedance measurement devices are known to one having skill in the art, the impedance measurement device will not be described in further detail.

During operation, the impedance measurement device outputs an output signal, which is transmitted through the insulated wire via cable 110. The frequency of the output signal is adjusted so the impedance measurement device 202 measures the frequency-dependant impedance of the insulated wire across a broad range of frequencies, such as from about 0 Hz to about 60 kHz. The measured impedance is converted to a digital signal by an analog-to-digital converter 206 and output from the impedance measurement device. Once the signal is in a digital form, it can be processed by data processing system 204. Collected impedance data may be archived, for example, in a memory 208 or a secondary storage 210 of data processing system 204.

One having skill in the art will appreciate that the data acquisition and data collection functionality of data analysis system 102 can be included in a device separate from data processing system 204. The separate device would comprise an impedance measurement system having an analog-to-digital converter, a processing unit, and a memory. The collected raw data would be stored on the separate device during data acquisition and can then be transferred to the data processing system 204 for processing.

Data processing system 204 comprises a central processing unit (CPU) or processor 212, a display device 214, an input/output (I/O) unit 216, secondary storage device 210, and memory 208. The data processing system may further comprise standard input devices such as a keyboard, a mouse or a speech processing means (each not illustrated).

Memory 208 comprises a program 220 for determining the affects of environmental conditions on the insulated wire. In an illustrative example, program 220 is implemented using MATLAB® software, however, the program can be implemented using another application programming or another programming language. As will be described in more detail below, program 220 receives broadband impedance measurements for the insulated wire from before and after the insulated wire is exposed to environmental condition, extracts the real and imaginary components of the dielectric functions from the impedance data, calculate the tan loss, and determines the effect of the environmental condition on the insulated wire based on the tan loss. MATLAB is a United States registered trademark of The MathWorks, Inc. of Natwick, Mass.

One having skill in the art will appreciate that the program can reside in memory on a system other than data processing system 204. Program 220 may comprise or may be included in one or more code sections containing instructions for performing their respective operations. While program 220 is described as being implemented as software, the program may be implemented as a combination of hardware and software or hardware alone. Also, one having skill in the art will appreciate that program 220 may comprise or may be included in a data processing device, which may be a client or a server, communicating with data processing system 204. Further, data analysis system 102 can itself be an impedance measurement device.

Although aspects of methods, systems, and articles of manufacture consistent with the present invention are depicted as being stored in memory, one having skill in the art will appreciate that these aspects may be stored on or read from other computer-readable media, such as secondary storage devices, like hard disks, floppy disks, and CD-ROM; a carrier wave received from a network such as the Internet; or other forms of ROM or RAM either currently known or later developed. Further, although specific components of data processing system 204 have been described, one having skill in the art will appreciate that a data processing system suitable for use with methods, systems, and articles of manufacture consistent with the present invention may contain additional or different components.

Data processing system 204 can itself also be implemented as a client-server data processing system. In that case, program 220 can be stored on the data processing system as a client, while some or all of the steps of the processing described below can be carried out on a remote server, which is accessed by the client over a network. The remote server can comprise components similar to those described above with respect to the data processing system, such as a CPU, an I/O, a memory, a secondary storage, and a display device.

Figure 3:
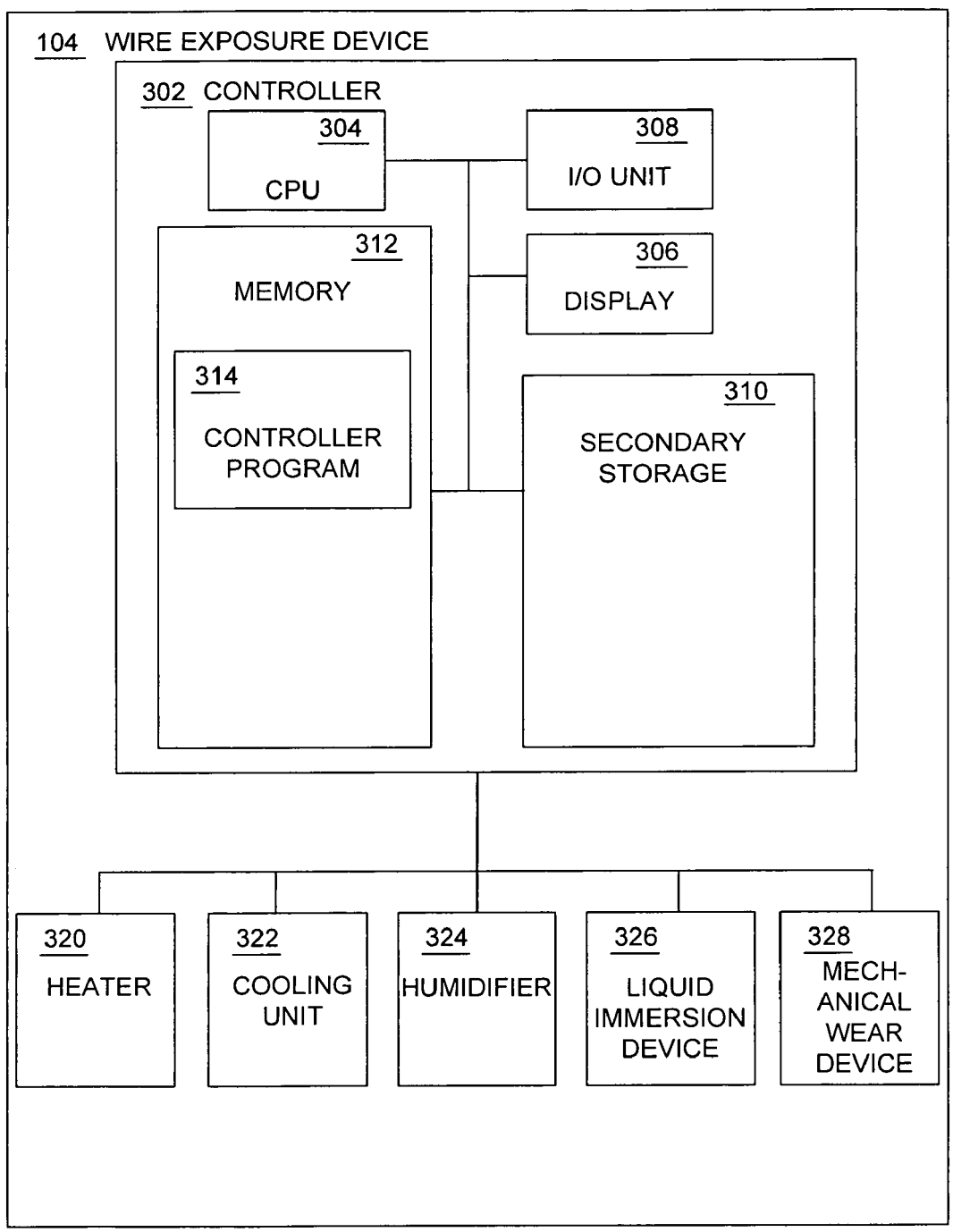
FIG. 3 is a block diagram of a wire exposure device consistent with the present invention.

FIG. 3 depicts a block diagram showing illustrative functional components of wire exposure device 104. The wire exposure device subjects the insulated wire to one or more environmental conditions, such as, but not limited to, heat, cold, humidity, liquid or mechanical wear and mechanical loading. As can be appreciated, the wire exposure device can have different configurations depending on the types of environmental conditions that it provides.

In the illustrative example of FIG. 3, the wire exposure device comprises a controller 302, which includes a central processing unit (CPU) 304, a display device 306, an input/output (I/O) unit 308, secondary storage device 310, and memory 312. Controller 302 may further comprise standard input devices such as a keyboard, a mouse or a speech processing means (each not illustrated). The controller's memory 312 comprises a controller program 314 that controls the various functional components of wire exposure device 104. The illustrative functional components include a heater 320, a cooling unit 322, a humidifier 324, a liquid immersion device 326, and a mechanical wear device 328. One having skill in the art will appreciate that the wire exposure device can comprise functional components other than those listed to provide other types of environmental conditions (e.g., radiation and mechanical loading). The individual functional components of the wire exposure device are known in the art and will not be described in more detail herein.

The controller communicates with the functional units via, for example, 4–20 ma signals, control relays or serial communications. The controller program controls the functional components by implementing processes controls, such as on/off controls, temperature controls, and humidity controls. In one embodiment, the control program can receive commands from program 220 via, for example, serial communication via a communication cable (not shown). Functional components, such as those described above, as well as their control and communication to controllers, are known in the art and will not be described in more detail herein.

Figure 4:
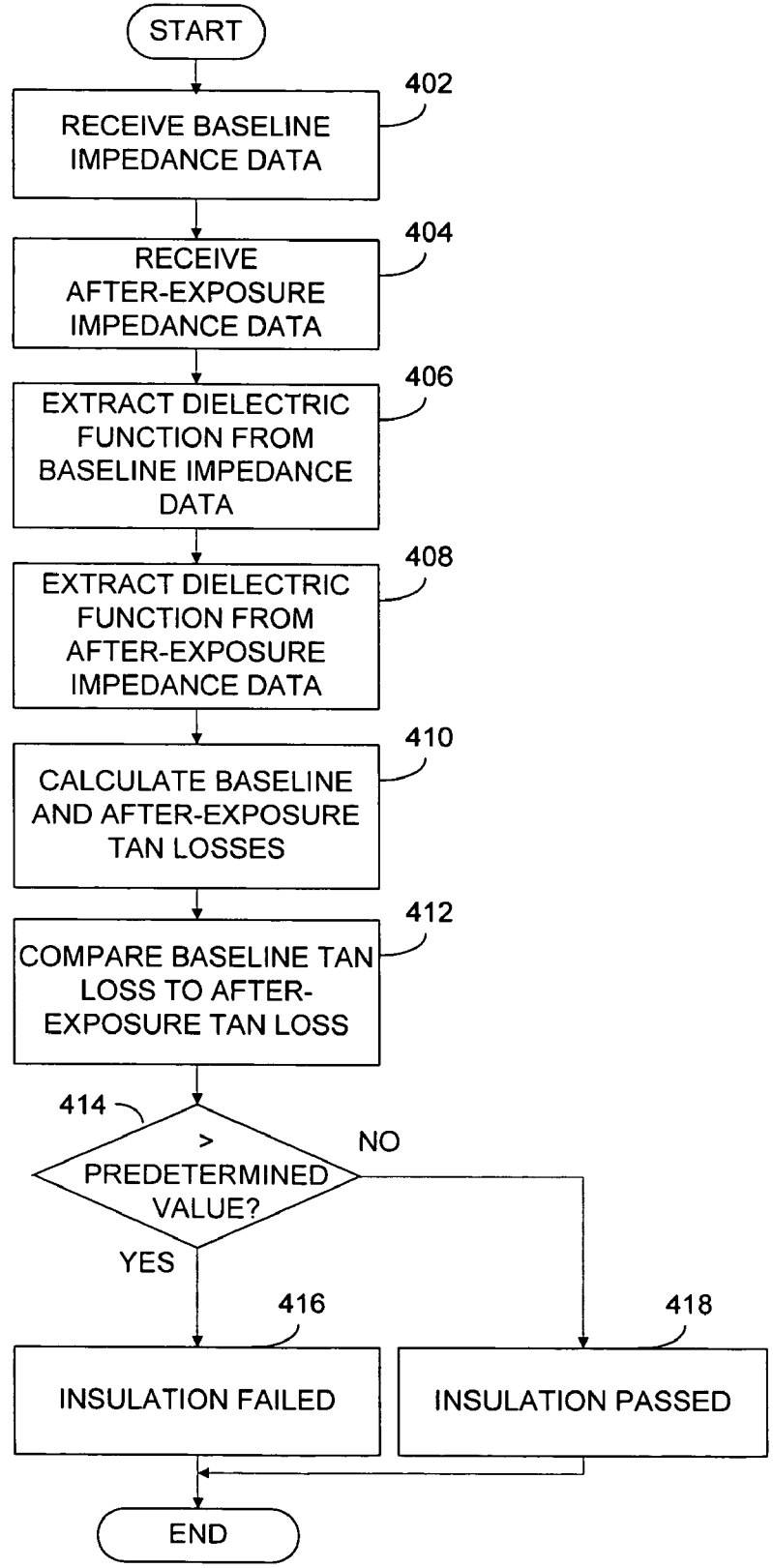
FIG. 4 is a flow diagram of the exemplary steps performed by the program for testing wire insulation consistent with the present invention.

FIG. 4 depicts a flow diagram illustrating the exemplary steps performed by program 220 for determining the affects of environmental conditions on the insulated wire. In summary, the broadband impedance of the insulated wire is measured before and after exposing the insulated wire to one or more environmental conditions. Then, the program uses the measured broadband impedance data to determine the affects of the environmental conditions on the wire. In the illustrative example, the insulated wire comprises two identical 1-meter long wires each having an insulated copper conductor in a twisted-pair configuration. The conductors each have Kynar® insulation. KYNAR is a registered trademark of Atofina Chemicals, Inc. of Philadelphia, Pa. Before the insulated wire is exposed to the environmental condition, the impedance measurement device measures the broadband impedance of the insulated wire, for example, at 70° F. and at a relative humidity of 50%. The open-circuit impedance is measured (i.e., when the insulated wire's conductors are not shorted), and the closed-circuit impedance is also measured (i.e., when the insulated wire's conductors are short circuited, preferably at an end opposite the measurement point). After the insulated wire is exposed to an environmental condition for a period of time, such as a temperature of 85° F. and a relative humidity of 85% for 168 hours, the impedance measurements are taken again.

In FIG. 4, first, the program receives the measured baseline impedance data for the insulated wire prior to the insulated wire being exposed to the environmental condition (step 402). The baseline impedance data includes the measured open-circuit and closed-circuit impedance data for the insulated wire. The measured baseline impedance data can be received, for example, as a data file in the memory or in the secondary storage. Alternatively, the program can measure, via the impedance measurement device, the measured impedance over a predetermined range of frequencies and store the frequency-dependent impedance magnitude and phase spectra, for example, in the memory or the secondary storage. In the illustrative example, the impedance measurement device measures the frequency-dependent impedance magnitude and phase spectra and transfers the spectra to the data processing system, where the spectra are saved in a baseline-data data file 222 in the secondary storage.

Figure 5:
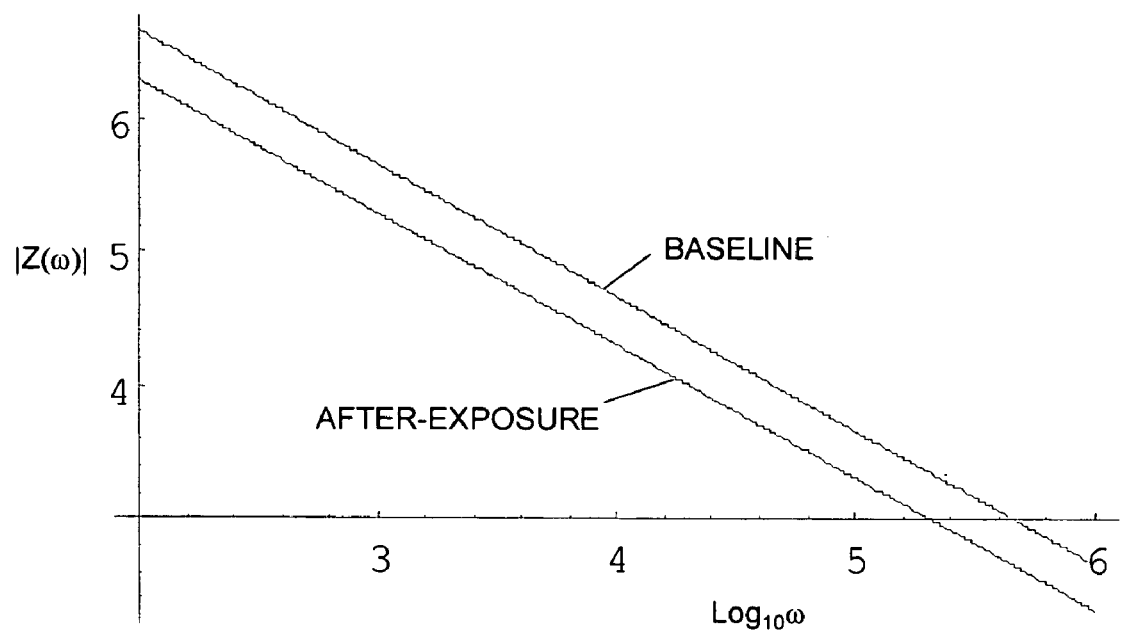
FIG. 5 is a measured baseline and after-exposure impedance magnitude spectra for the illustrative insulated wire in an open-circuit configuration.
Figure 6:
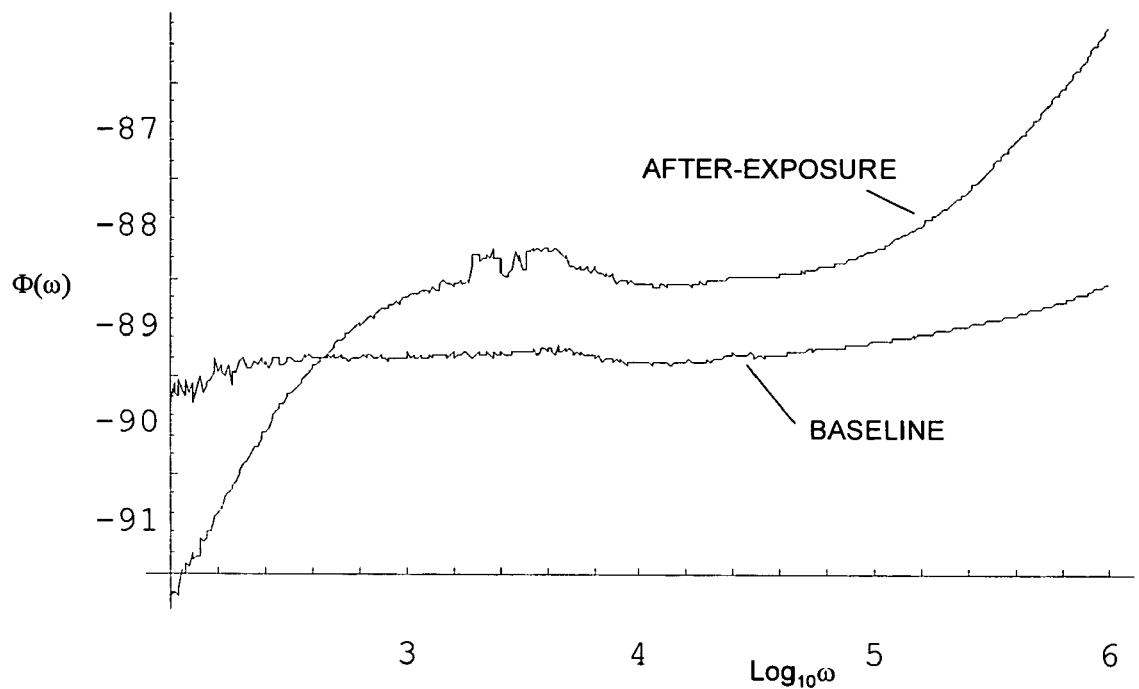
FIG. 6 is a measured baseline and after-exposure impedance phase spectra for the illustrative insulated wire in an open-circuit configuration.

The data for the measured baseline impedance magnitude spectrum for the illustrative example, wherein the insulated wire is in an open-circuit configuration, is shown in FIG. 5. The phase spectrum for the measured baseline impedance data, wherein the insulated wire is in an open-circuit configuration, is depicted in FIG. 6.

Figure 7:
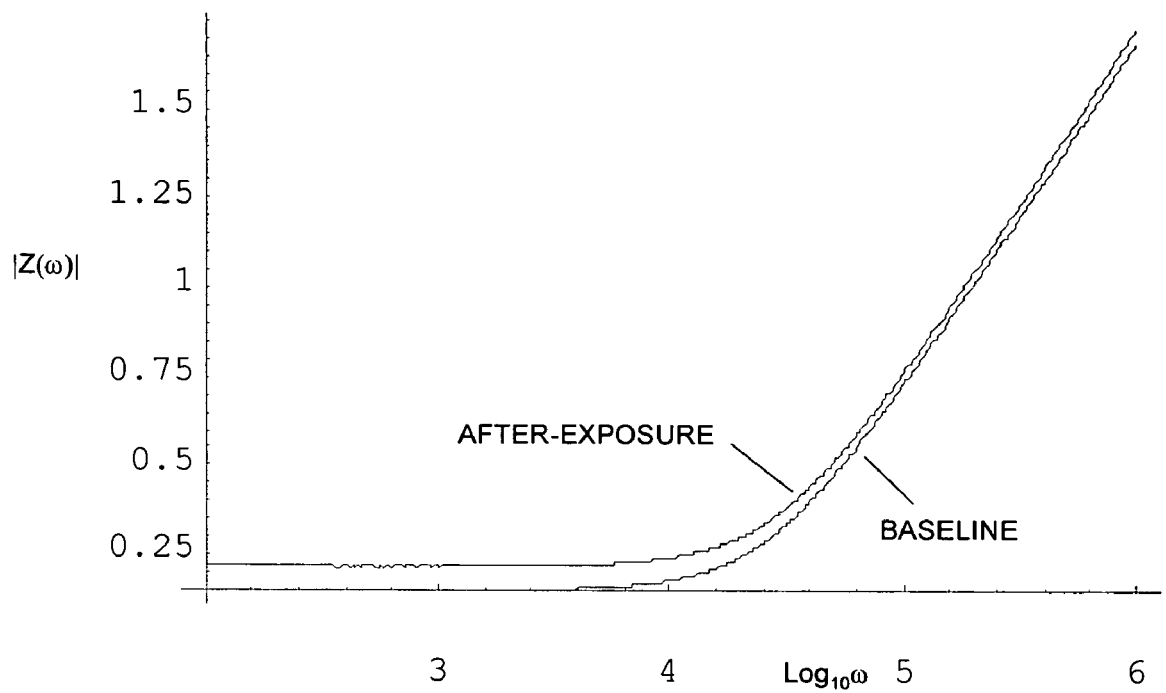
FIG. 7 is a measured baseline and after-exposure impedance magnitude spectra for the illustrative insulated wire in a short-circuit configuration.
Figure 8:
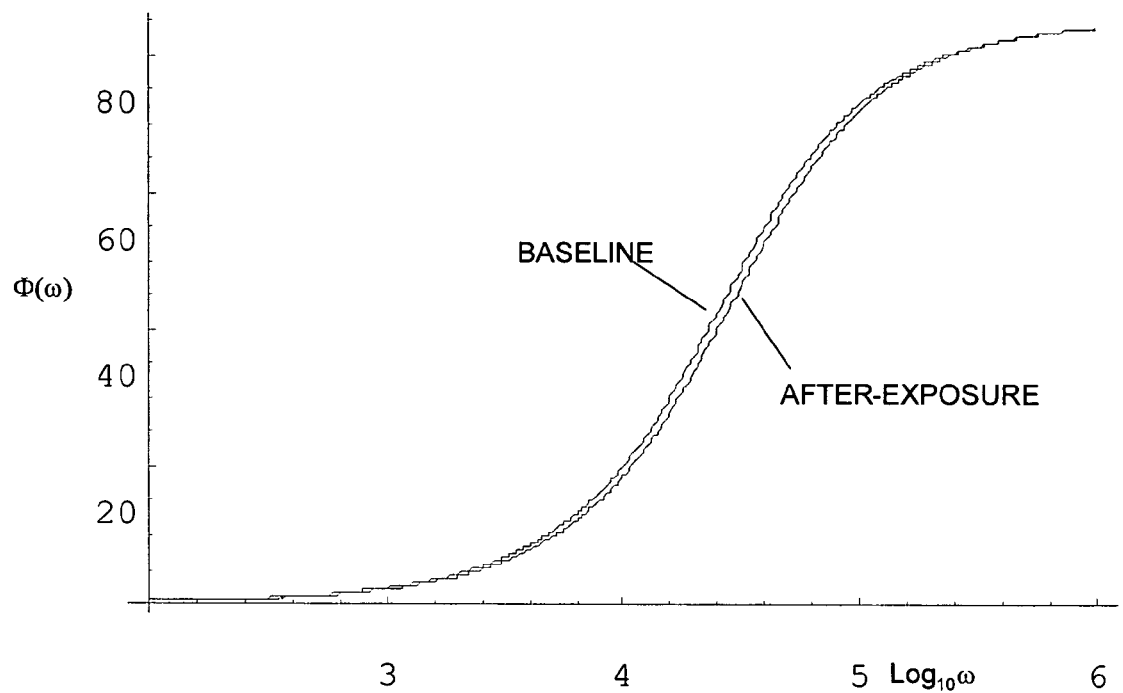
FIG. 8 is a measured baseline and after-exposure impedance phase spectra for the illustrative insulated wire in a short-circuit configuration.

Further, the data for the measured baseline impedance magnitude spectrum for the illustrative example, wherein the insulated wire is in a short-circuit configuration, is shown in FIG. 7. The phase spectrum for the measured baseline impedance data, wherein the insulated wire is in a short-circuit configuration, is depicted in FIG. 8.

Then, the insulated wire is exposed to one or more environmental conditions in the wire exposure device for a predetermined period of time. In the illustrative example, the insulated wire is exposed to a temperature of 85° F. and a relative humidity of 85% for 165 hours, however, the insulated wire can be exposed to other environmental conditions for a different amount of time. The after-exposure broadband impedance of the insulated wire is then measured. That is, the impedance measurement device measures the after-exposure magnitude and phase of the insulated wire's impedance when the insulated wire is in an open-circuit configuration and when the insulated wire is in a short-circuit configuration (See, FIGS. 5–8).

The program then receives the measured after-exposure impedance data for the insulated wire (step 404). The measured after-exposure impedance data can be received, for example, as a data file in the memory or in the secondary storage. Alternatively, the program can measure, via the impedance measurement device, the measured after-exposure impedance over a predetermined range of frequencies and store the frequency-dependent impedance magnitude and phase spectra, for example, in the memory or the secondary storage. In the illustrative example, the impedance measurement device measures the frequency-dependent impedance magnitude and phase spectra and transfers the spectra to the data processing system, where the spectra are saved in an after-exposure-data data file 224 in the secondary storage.

The data for the measured after-exposure impedance magnitude spectrum for the illustrative example, wherein the insulated wire is in an open-circuit configuration, is shown in FIG. 5. The phase spectrum for the measured after-exposure impedance data, wherein the insulated wire is in an open-circuit configuration, is depicted in FIG. 6.

Further, the data for the measured after-exposure impedance magnitude spectrum for the illustrative example, wherein the insulated wire is in a short-circuit configuration, is shown in FIG. 7. The phase spectrum for the measured after-exposure impedance data, wherein the insulated wire is in a short-circuit configuration, is depicted in FIG. 8.

One having skill in the art will appreciate that the illustrative steps performed by the program can be performed in orders different than described herein, and additional steps can also be performed. For example, the impedance measurement device can measure both the baseline and after-exposure impedance data before the program receives the measured impedance data. Then, for example, the program can receive the after-exposure impedance data followed by the baseline impedance data.

After the program receives the baseline and after-exposure impedance data, the program extracts the real ($\in_1(\omega)$) and imaginary ($\in_2(\omega)$) components of the insulated wire's dielectric function ($\in(\omega)$) from the baseline impedance data (step 406) and the after-exposure impedance data (step 408). A cable, such as the insulated wire of the illustrative example, has a frequency-dependent resistance ($R(\omega)$) per meter, conductance ($C(\omega)$) per meter, inductance ($L(\omega)$) per meter, and conductance ($G(\omega)$) per meter. The capacitance and conductance are related to the cable's dielectric function $\in(\omega)$ as shown below in Equation (1).

$$G(\omega)+i\omega C(\omega)=\Lambda\omega(\omega) \qquad \text{Equation (1)}$$

In Equation (1), "$\Lambda$" is a structure factor that depends on the insulated wire's configuration (e.g., twisted pair) and is independent of frequency. For the insulated wire of the illustrative example, the structure factor A can be computed as shown below in Equation (2).

$$\Lambda = \frac{\pi}{\cosh^{-1}\left(\frac{s}{d}\right)} \qquad \text{Equation (2)}$$

In Equation (2), "d" represents the diameter of each wire of the twisted pair of the insulated wire and "s" represents a center-to-center distance between the conductors of the wires of the insulated wire.

When the impedance testing device effects a voltage between the wires of the twisted-pair insulated wire, the voltage and current can be computed by Equations (3) and (4).

$$\frac{\partial}{\partial x}V(x,t) = -I(x,t)R - \frac{\partial}{\partial t}LI(x,t) \qquad \text{Equation (3)}$$

$$\frac{\partial}{\partial x}I(x,t) = -GV(x,t) - \frac{\partial}{\partial t}CV(x,t) \qquad \text{Equation (4)}$$

The voltage of Equation (3) and the current of Equation (4) define a set of normal node waves $A_\pm(x,t)$ that propagate through the insulated wire. $A_\pm(x,t)$ is further shown below in Equation (5).

$$A_\pm(x,t)=\exp[\pm\gamma(\omega)x-i\omega t] \qquad \text{Equation (5)}$$

In Equation (5), "$\gamma$" is a propagation function, which can be defined as shown in Equation (6).

$$\gamma(\omega)=\sqrt{(R(\omega)+i\omega L(\omega))G(\omega)+i\omega C(\omega))}=(\alpha(\omega)+i\beta(\omega)) \qquad \text{equation (6)}$$

In Equation (6), $\alpha(\omega)$ is the insulated wire's dissipation coefficient per meter. $2\pi/\beta(\omega)$ represents the wavelength of the normal mode wave $A_\pm(x,t)$ that propagate through the insulated wire. $v(\omega)=\omega/\beta(\omega)$ represents the speed ($v(\omega)$) at which the signals can propagate on the insulated wire. The propagation function can be rewritten as shown below in Equation (7).

$$\gamma(\omega)=\sqrt{(R(\omega)+i\omega L(\omega))i\Lambda\omega\in(\omega)} \qquad \text{Equation (7)}$$

Knowing the propagation function, the frequency-dependent open-circuit and short-circuit impedances are shown by Equations (8) and (9).

$$Z_{open}(\omega)=Z_0(\omega)\coth[\gamma(\omega)l] \qquad \text{Equation (8)}$$

$$Z_{short}(\omega)=Z_0(\omega)\tanh[\gamma(\omega)l] \qquad \text{Equation (9)}$$

In the illustrative example, the insulated wire's length "l" is 1.0 meter and yields the characteristic impedance $Z_0(\omega)$ shown below in Equation (10).

$$Z_0(\omega) = \sqrt{\frac{R(\omega) + i\omega L(\omega)}{G(\omega) + i\omega C(\omega)}} \quad \text{Equation (10)}$$

The characteristic impedance can also be computed as the product of the measured open-circuit and short-circuit impedances as shown below in Equation (11).

$$Z_0^2 = Z_{short}(\omega) Z_{open}(\omega) \quad \text{Equation (11)}$$

Further, the propagation function can be found from the ratio of the measured open-circuit and short-circuit impedances as shown in Equation (12).

$$\gamma(\omega)l = \tanh^{-1} \sqrt{\frac{Z_{short}(\omega)}{Z_{open}(\omega)}} \quad \text{Equation (12)}$$

Having obtained the characteristic impedance and the propagation function from the measured open-circuit and short-circuit impedance (i.e., using Equations (11) and (12)), the program can calculate the real and imaginary components of the dielectric function. Equations (7), (10), (11) and (12) yield the following relationships shown in Equations (13) and (14).

$$\gamma(\omega)Z_0(\omega) = R(\omega) + i\omega L(\omega) \quad \text{Equation (13)}$$

$$\frac{\gamma(\omega)}{Z_0(\omega)} = i\Lambda \omega \varepsilon(\omega) \quad \text{Equation (14)}$$

Accordingly, the frequency-dependent resistance ($R(\omega)$) per meter, inductance ($L(\omega)$) per meter, real component of the dielectric function ($\in(\omega)$), and imaginary component of the dielectric function ($\in(\omega)$) can be calculated based on the characteristic impedance $Z_0(\omega)$ and propagation function $\gamma(\omega)$ as shown below in Equations (15), (16), (17) and (18).

$$R(\omega) = \text{Re}[\gamma(\omega)Z_0(\omega)] \quad \text{Equation (15)}$$

$$L(\omega) = \text{Im}[\gamma(\omega)Z_0(\omega)/\omega] \quad \text{Equation (16)}$$

$$\varepsilon_1(\omega) = -\text{Re}\left[\frac{\gamma(\omega)}{\omega \Lambda Z_0(\omega)}\right] \quad \text{Equation (17)}$$

$$\varepsilon_2(\omega) = \text{Im}\left[\frac{\gamma(\omega)}{\omega \Lambda Z_0(\omega)}\right] \quad \text{Equation (18)}$$

Therefore, having obtained the characteristic impedance and the propagation function from the measured open-circuit and short-circuit impedance (i.e., using Equations (11) and (12)), the program then uses Equations (17) and (18) to calculate the real ($\in_1(\omega)$) and imaginary ($\in_2(\omega)$) components of the dielectric function ($\in(\omega)$). In the illustrative example, the structure factor ($\Lambda$) of the insulated wire is calculated using the known illustrative diameter (d)=1 mm and known illustrative center-to-center distance (s)=2 mm.

Figure 9:
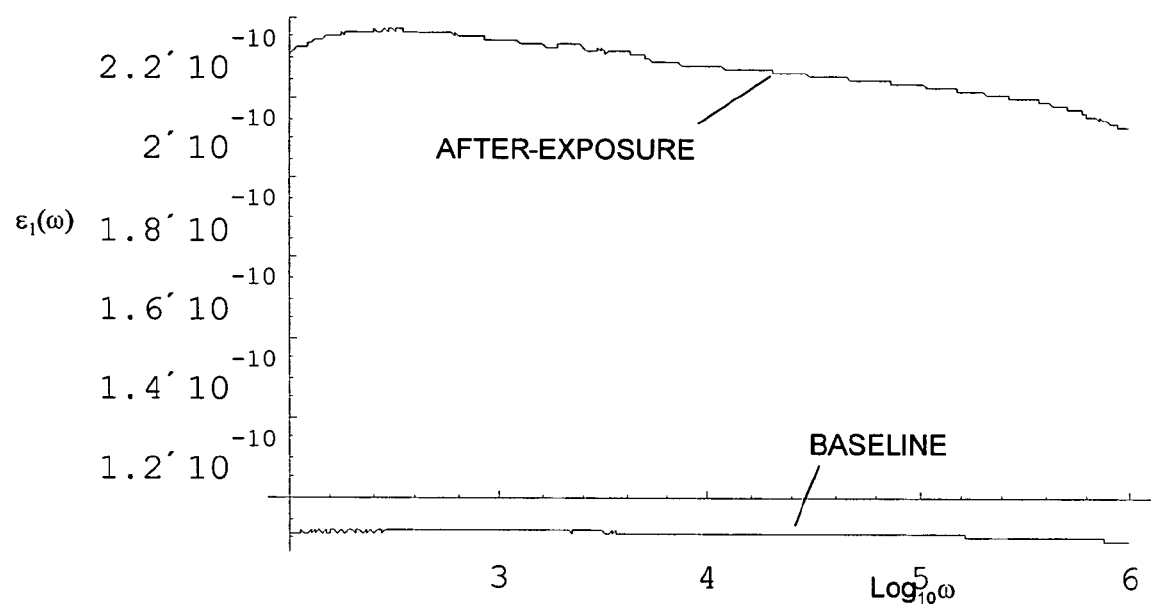
FIG. 9 illustrates real components of the dielectric functions for the baseline and after-exposure impedances.
Figure 10:
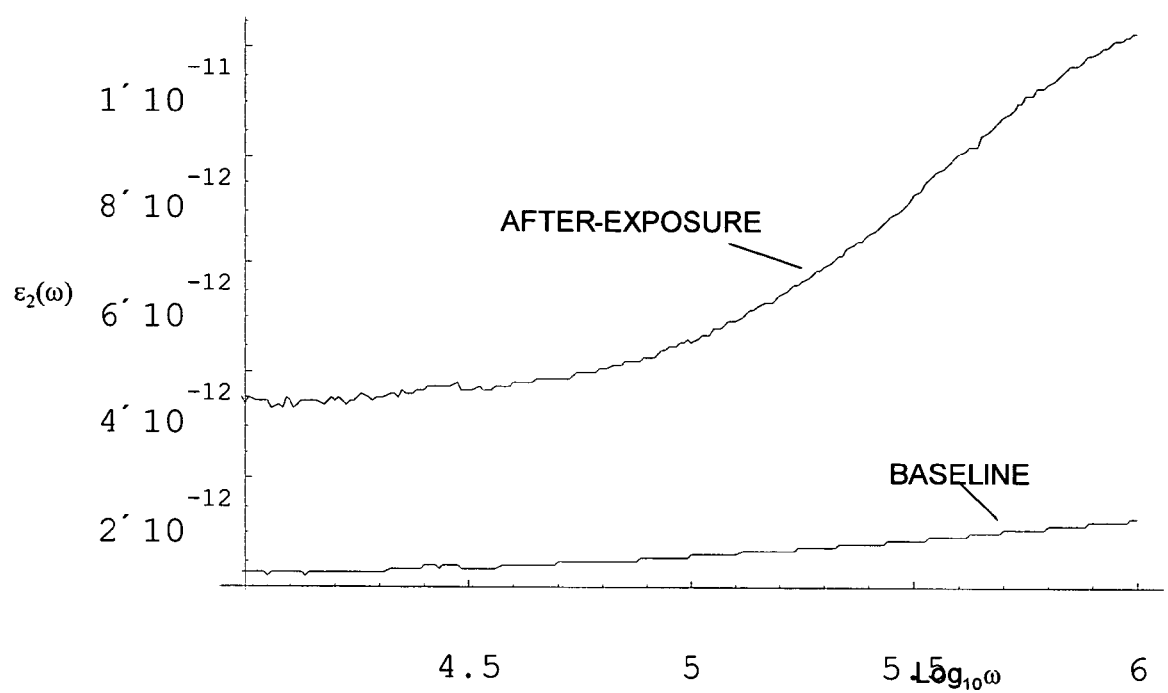
FIG. 10 illustrates imaginary components of the dielectric functions for the baseline and after-exposure impedances.

The real and imaginary components of the dielectric function for the baseline impedance data, as calculated by the program, are shown in FIGS. 9 and 10, respectively After computing the real and imaginary components of the dielectric function for the baseline impedance data in step 406, the program computes the real and imaginary components of the dielectric function for the after-exposure impedance data (step 408). To perform this step, the program uses the same calculations as used in step 406, however, the program uses the after-exposure impedance data instead of the baseline impedance data. The calculated real and imaginary components of the dielectric function for the after-exposure impedance data are shown in FIGS. 9 and 10, respectively.

Then, the program calculates the tan loss of the baseline and after-exposure dielectric functions ($\in(\omega)$) (step 410). As noted above, the "tan loss" for purposes of this disclosure is the tangent of the ratio of the imaginary component of the dielectric function to the real component of the dielectric function as shown below in Equation (19).

$$\tan loss = \tan\left(\frac{\varepsilon_1(\omega)}{\varepsilon_2(\omega)}\right) \quad \text{Equation (19)}$$

The tan loss of the insulated wire exhibits different characteristics depending on how the insulated wire is affected by the environmental condition. If the insulated wire is not affected by the environmental condition, then the tan loss of the after-exposure dielectric function should be substantially the same as the tan loss of the baseline dielectric function (step 412). However, the more the insulated wire is affected by the environmental condition, the greater the difference will be between the tan loss of the after-exposure dielectric function and the tan loss of the baseline dielectric function.

FIG. 11 depicts the tan loss of the after-exposure dielectric function and the tan loss of the baseline dielectric function for the illustrative example, as calculated by the program. As depicted in FIG. 11, the difference between the tan loss of the after-exposure dielectric function and the tan loss of the baseline dielectric function is generally less than 0.04. Depending on the strictness of the user's criteria for how little the insulated wire should preferably be affected by the environmental condition, the maximum difference in the tan losses of less than 0.04 may be acceptable.

The program compares the absolute value of the difference in the tan losses to a predetermined value to determine whether the affect of the environmental condition on the insulated wire is acceptable (step 414). Preferably, the program compares the maximum absolute value of the difference in the tan losses to the predetermined value. For example, in the illustrative example shown in FIG. 11, the maximum absolute value of the difference in tan losses is around 0.04. The program compares the value of 0.04 to a predetermined value, such as 0.2. Alternatively, the program can make a different comparison for its determination. For example, the program can compare the average of the absolute value of the difference in tan losses to the predetermined value or determine whether the tan loss of the after-exposure dielectric function is, for example, a factor of ten greater than the tan loss of the baseline dielectric function.

If the program determines that the affect of the environmental condition on the insulated wire is unacceptable in step 414 (i.e., the difference in tan losses is greater than the predetermined value), then the program determines that the insulation has failed (step 416). In this step, the program outputs, to the display device, the tan losses as shown in FIG. 11 with an indication that the insulation failed. However, if the program determines that the affect of the environmental condition on the insulated wire is acceptable in step 414 (i.e., the difference in tan losses is less than or equal to the predetermined value), then the program determines that the insulation has passed (step 418). If the insulation has passed the environmental condition test, then the program outputs to the display device the tan losses as shown in FIG. 11 with an indication that the insulation passed. One having skill in the art will appreciate that the program can output alternative or additional information in steps 416 and 418 such as the dielectric functions and the broadband impedances.

Therefore, methods, systems, and articles of manufacture consistent with the present invention provide a determination of the environmental resistance of wire insulation by observing changes in the tan loss of the insulated wire. Further, methods, systems, and articles of manufacture consistent with the present invention can provide beneficial improvements over conventional approaches, in that: lengthy exposure tests are not required and a quantitative measurement of susceptibility of provided. The results can be used, for example, to develop wire insulation for a particular application.

As an alternative to using the program to determine an insulation's susceptibility to an environmental condition, one having skill in the art will appreciate that the user can also determine the insulation's susceptibility by visually analyzing either the graphical or numerical representations of the broadband impedance, dielectric functions and tan losses.

The foregoing description of an implementation of the invention has been presented for purposes of illustration and description. The description is not exhaustive and does not limit the invention to the precise form disclosed. Modifications and variations are possible in light of the above teachings or may be acquired from practicing the invention. For example, the described implementation includes software but the present implementation may be implemented as a combination of hardware and software or hardware alone. Further, the illustrative processing steps performed by the program can be executed in an order different than described above, and additional processing steps can be incorporated. The invention may be implemented with both object-oriented and non-object-oriented programming systems. The scope of the invention is defined by the claims and their equivalents.

When introducing elements of the present invention or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions without departing from the scope of the invention, it is intended that all matter contained in the above description or shown in the accompanying drawings shall be interpreted as illustrative and not in a limiting sense.

What is claimed is:

1. A method in a data processing system having a program for determining the environmental resistance of a wire insulation, the method comprising the steps of:
    obtaining a first broadband impedance of the wire prior to the wire being exposed to an environmental condition;
    obtaining a second broadband impedance of the wire after the wire has been exposed to the environmental condition;
    extracting a first real component and a first imaginary component of a first dielectric function of the wire from the first broadband impedance;
    extracting a second real component and a second imaginary component of a second dielectric function of the wire from the second broadband impedance;
    calculating a first tangent of a ratio of the first imaginary component to the first real component of the first dielectric function;
    calculating a second tangent of a ratio of the second imaginary component to the second real component of the second dielectric function; and
    determining the environmental resistance of the wire insulation by comparing the first tangent to the second tangent.

2. A method of claim 1 further comprising the step of measuring the first broadband impedance.

3. A method of claim 1 further comprising the step of measuring the second broadband impedance.

4. A method of claim 1 further comprising the step of receiving the first broadband impedance.

5. A method of claim 1 further comprising the step of receiving the second broadband impedance.

6. A method of claim 1 further comprising the step of outputting a result of the determination.

7. A method of claim 1 wherein the step of determining the environmental resistance of the wire insulation comprises determining whether an absolute value of a difference between the second tangent from the first tangent exceeds a predetermined value.

8. A computer-readable medium containing instructions that cause a data processing system having a program to perform a method for determining the environmental resistance of a wire insulation, the method comprising the steps of:
    obtaining a first broadband impedance of the wire prior to the wire being exposed to an environmental condition;
    obtaining a second broadband impedance of the wire after the wire has been exposed to the environmental condition;
    extracting a first real component and a first imaginary component of a first dielectric function of the wire from the first broadband impedance;
    extracting a second real component and a second imaginary component of a second dielectric function of the wire from the second broadband impedance;
    calculating a first tangent of a ratio of the first imaginary component to the first real component of the first dielectric function;
    calculating a second tangent of a ratio of the second imaginary component to the second real component of the second dielectric function; and
    determining the environmental resistance of the wire insulation by comparing the first tangent to the second tangent.

9. A computer-readable medium of claim 8 further comprising the step of measuring the first broadband impedance.

10. A computer-readable medium of claim 8 further comprising the step of:
    measuring the second broadband impedance.

11. A computer-readable medium of claim 8 further comprising the step of receiving the first broadband impedance.

12. A computer-readable medium of claim 8 further comprising the step of receiving the second broadband impedance.

13. A computer-readable medium of claim 8 further comprising the step of outputting a result of the determination.

14. A computer-readable medium of claim 8 wherein the step of determining the environmental resistance of the wire insulation comprises determining whether an absolute value of a difference between the second tangent from the first tangent exceeds a predetermined value.

15. A data processing system for determining the environmental resistance of a wire insulation, the data processing system comprising:
   a memory having a program that:
      obtains a first broadband impedance of the wire prior to the wire being exposed to an environmental condition,
      obtains a second broadband impedance of the wire after the wire has been exposed to the environmental condition,
      extracts a first real component and a first imaginary component of a first dielectric function of the wire from the first broadband impedance,
      extracts a second real component and a second imaginary component of a second dielectric function of the wire from the second broadband impedance,
      calculates a first tangent of a ratio of the first imaginary component to the first real component of the first dielectric function,
      calculates a second tangent of a ratio of the second imaginary component to the second real component of the second dielectric function, and
      determines the environmental resistance of the wire insulation by comparing the first tangent to the second tangent; and
   a processing unit that runs the program.

16. A data processing system of claim 15 further comprising an impedance measurement device.

17. A data processing system of claim 15 wherein the program outputs a result of the determination.

18. A data processing system of claim 15 wherein the program determines the environmental resistance of the wire insulation by determining whether an absolute value of a difference between the second tangent from the first tangent exceeds a predetermined value.

19. A data processing system for determining the environmental resistance of a wire insulation, the data processing system comprising:
   means for obtaining a first broadband impedance of the wire prior to the wire being exposed to an environmental condition;
   means for obtaining a second broadband impedance of the wire after the wire has been exposed to the environmental condition;
   means for extracting a first real component and a first imaginary component of a first dielectric function of the wire from the first broadband impedance;
   means for extracting a second real component and a second imaginary component of a second dielectric function of the wire from the second broadband impedance;
   means for calculating a first tangent of a ratio of the first imaginary component to the first real component of the first dielectric function;
   means for calculating a second tangent of a ratio of the second imaginary component to the second real component of the second dielectric function; and
   means for determining the environmental resistance of the wire insulation by comparing the first tangent to the second tangent.

* * * * *